(12) United States Patent
Cala' et al.

(10) Patent No.: US 10,757,779 B2
(45) Date of Patent: Aug. 25, 2020

(54) LED DRIVER CIRCUIT, CORRESPONDING DEVICE AND METHOD

(71) Applicant: STMicroelectronics S.r.l., Agrate Brianza (MB) (IT)

(72) Inventors: Ignazio Cala', Syracuse (IT); Santi Carlo Adamo, Aci Castello (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/273,661

(22) Filed: Feb. 12, 2019

(65) Prior Publication Data
US 2019/0261473 A1   Aug. 22, 2019

(30) Foreign Application Priority Data
Feb. 16, 2018   (IT) .................. 102018000002767

(51) Int. Cl.
| H05B 33/08 | (2020.01) |
| H05B 45/37 | (2020.01) |
| G06F 13/42 | (2006.01) |
| H03K 7/08 | (2006.01) |
| H05B 45/10 | (2020.01) |

(52) U.S. Cl.
CPC .......... *H05B 45/37* (2020.01); *G06F 13/4291* (2013.01); *H03K 7/08* (2013.01); *H05B 45/10* (2020.01); *G06F 2213/0016* (2013.01); *G06F 2213/0052* (2013.01)

(58) Field of Classification Search
CPC ............ H05B 33/0815; H05B 33/0839; H05B 33/0845; H05B 33/0878

USPC ........................................ 315/186, 193, 307
See application file for complete search history.

(56) References Cited

U.S. PATENT DOCUMENTS

| 9,275,000 B2 | 3/2016 | Cala' | |
| 2010/0156467 A1 | 6/2010 | Sun et al. | |
| 2012/0217882 A1 | 8/2012 | Wong et al. | |
| 2012/0323394 A1* | 12/2012 | Gandhi | H05B 33/0857 700/297 |
| 2013/0169325 A1* | 7/2013 | Su | H05B 33/0815 327/145 |
| 2014/0177664 A1* | 6/2014 | Osterried | H05B 45/00 372/50.1 |
| 2014/0203720 A1* | 7/2014 | Horsky | H05B 45/46 315/193 |
| 2016/0183342 A1* | 6/2016 | Jang | H05B 45/10 315/307 |
| 2019/0141816 A1* | 5/2019 | Zhu | H05B 33/0887 |

FOREIGN PATENT DOCUMENTS

| JP | 2014186938 A | 10/2014 |
| WO | 0002134 A2 | 1/2000 |

* cited by examiner

*Primary Examiner* — Tung X Le
(74) *Attorney, Agent, or Firm* — Slater Matsil, LLP

(57) ABSTRACT

A circuit includes a set of LED driver devices and a controller including a set of nodes coupled to a first slave address pin and a second slave address pin in each LED driver devices in the set of LED driver devices. Each LED driver device includes: a finite state machine (FSM) configured to generate LED drive PWM-modulated signal patterns; an oscillator configured to generate a clock signal for the FSM; a first signal path activatable between the first slave address pin and the FSM; and a second signal path activatable between the FSM and the second slave address pin.

25 Claims, 3 Drawing Sheets

FIG. 3

| DEVICE | A0  | A1  | S.Add |
|--------|-----|-----|-------|
| LD #1  | gnd | gnd | 58h   |
| LD #2  | Vdd | gnd | 59h   |
| LD #3  | Vdd | Vdd | 5Bh   |
| LD #4  | gnd | Vdd | 5Ah   |

FIG. 4

| Daisy Chain Config Register (R/W) | | | | | | | |
|----|----|----|----|----|----|----|----|
| b7 | b6 | b5 | b4 | b3 | b2 | b1 | b0 |
|    |    |    |    |    |    | chain_out_en | chain_in_en |

LED DRIVER CIRCUIT, CORRESPONDING DEVICE AND METHOD

CROSS-REFERENCE TO RELATED APPLICATIONS

This application claims priority to Italian Patent Application No. 102018000002767, filed on Feb. 16, 2018, which application is hereby incorporated herein by reference.

TECHNICAL FIELD

The description relates generally to driver circuits, and in particular embodiments to light-emitting diode (LED) driver circuit, a corresponding device and method.

BACKGROUND

A desirable feature in (e.g., integrated) circuits for driving LEDs is the ability for a user to start simultaneously and maintain the synchronization of the channels in a set of LED driver devices coupled, e.g. in a star or chain topology.

These LED drivers may use dedicated pins in order to facilitate synchronization of the various devices. In certain applications, e.g. low-cost and/or small devices, a reduced number of pins used for that purpose would represent a desirable feature.

SUMMARY

An object of one or more embodiments is to contribute in pursuing a reduction of the number of pins in such arrangements without this reduction being detrimental to operation.

One or more embodiments may relate to a corresponding device, e.g. a circuit as discussed previously coupled to a set of LED sources driven thereby.

One or more embodiments may relate to a corresponding method.

One or more embodiments facilitate coupling in a star or chain topology a number of LED driver devices (e.g., N such devices) with a simultaneous start-up capability of their LED channels obtained by a microcontroller without dedicated synchronization pins, thereby reducing the number of pins involved.

One or more embodiments may provide an architecture for an integrated LED driver circuit which facilitates simultaneously switching-on of channels of a plurality of LED driver devices.

One or more embodiments facilitate automatic synchronization of the PWM patterns from a plurality of LED drivers connected, e.g., in a chain arrangement by dispensing with the use of dedicated synchronization pins.

One or more embodiments make it possible, for each one of a plurality of LED driver devices, to reconfigure some LED driver input-output pins (IOs) used to assign a local I2C address to each LED driver with the capability of using a single clock signal either from a LED driver master device in a chain connection or from an external clock source.

In one or more embodiments, a LED driver can be configured as a master or slave unit via an I2C bus by its local I2C address.

In one or more embodiments, various LED drivers in a set can be started simultaneously by an I2C (global) address.

In one or more embodiments, once started simultaneously via an I2C global address recognized by all the LED driver devices in a set, the various LED drivers, can then be addressed individually by e.g. a microcontroller by using the local I2C slave address of each LED driver, so that the configuration of the channels in each LED driver can be changed as desired.

BRIEF DESCRIPTION OF THE DRAWINGS

One or more embodiments will now be described, by way of example only, with reference to the annexed figures, wherein:

FIGS. 3 and 4 are exemplary of possible configurations in embodiments.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

One or more embodiments may apply to arrangements wherein a microcontroller is intended to co-operate with a plurality of LED drivers.

One or more embodiments as exemplified herein refer to a circuit arrangement wherein an (external) microcontroller (see, e.g., MC in FIG. 2) may start-up (different) channels in a number (e.g. N) of LED drivers simultaneously.

One or more embodiments may involve reconfiguring some "non-dedicated" LED driver input/output pins (IOs) used to assign respective local I2C addresses to the N LED drivers in order to facilitate exploiting a single clock signal from a LED driver master device in a chain (or from an external clock source) thereby dispensing with dedicated synchronization input and output pins for each of the N LED drivers.

Figure 1:
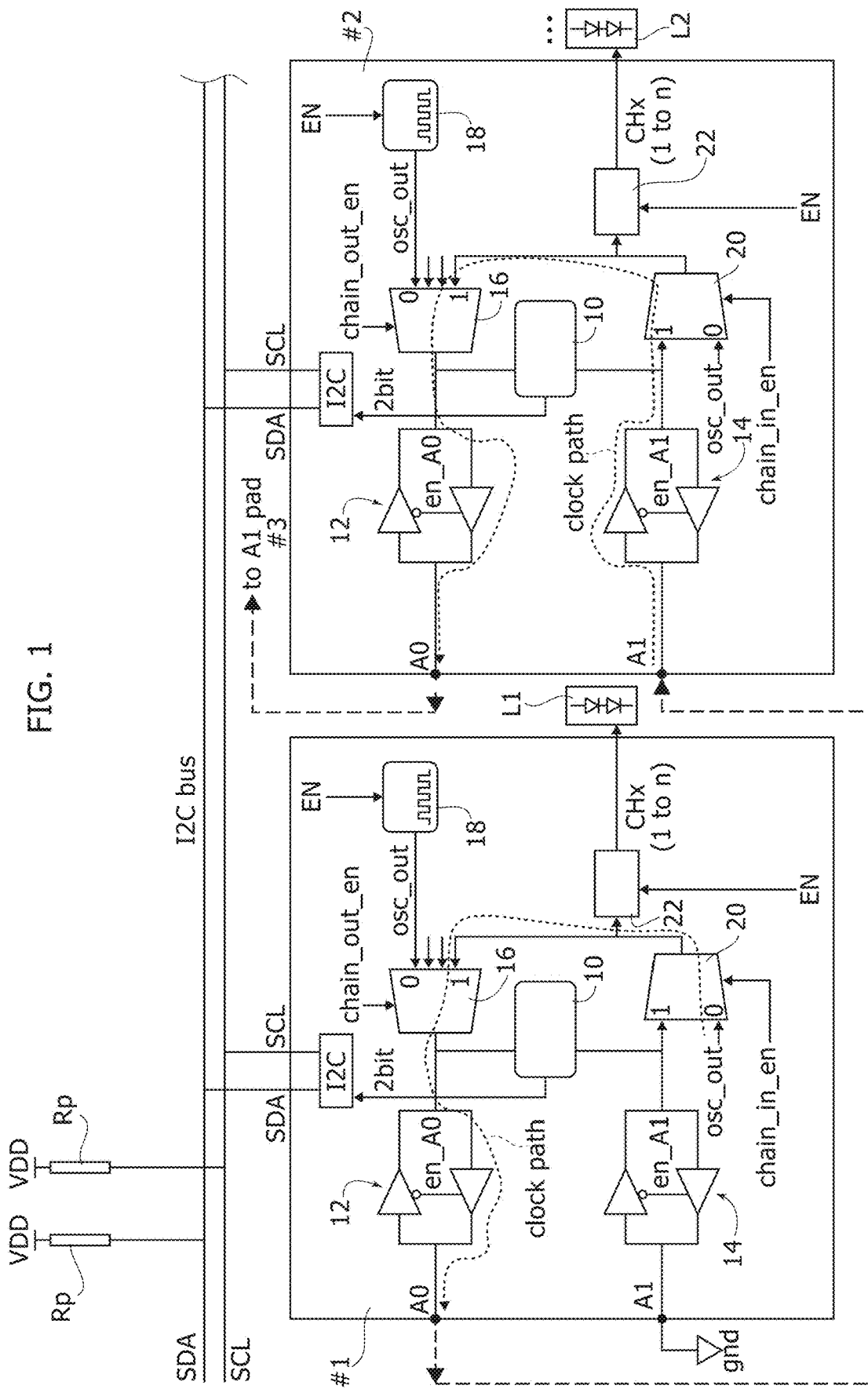
FIG. 1 is an exemplary circuit diagram of embodiments.

In FIG. 1 a circuit arrangement is exemplified including a number N of LED drivers referred to as #1, #2, . . . and so on.

Figure 2:
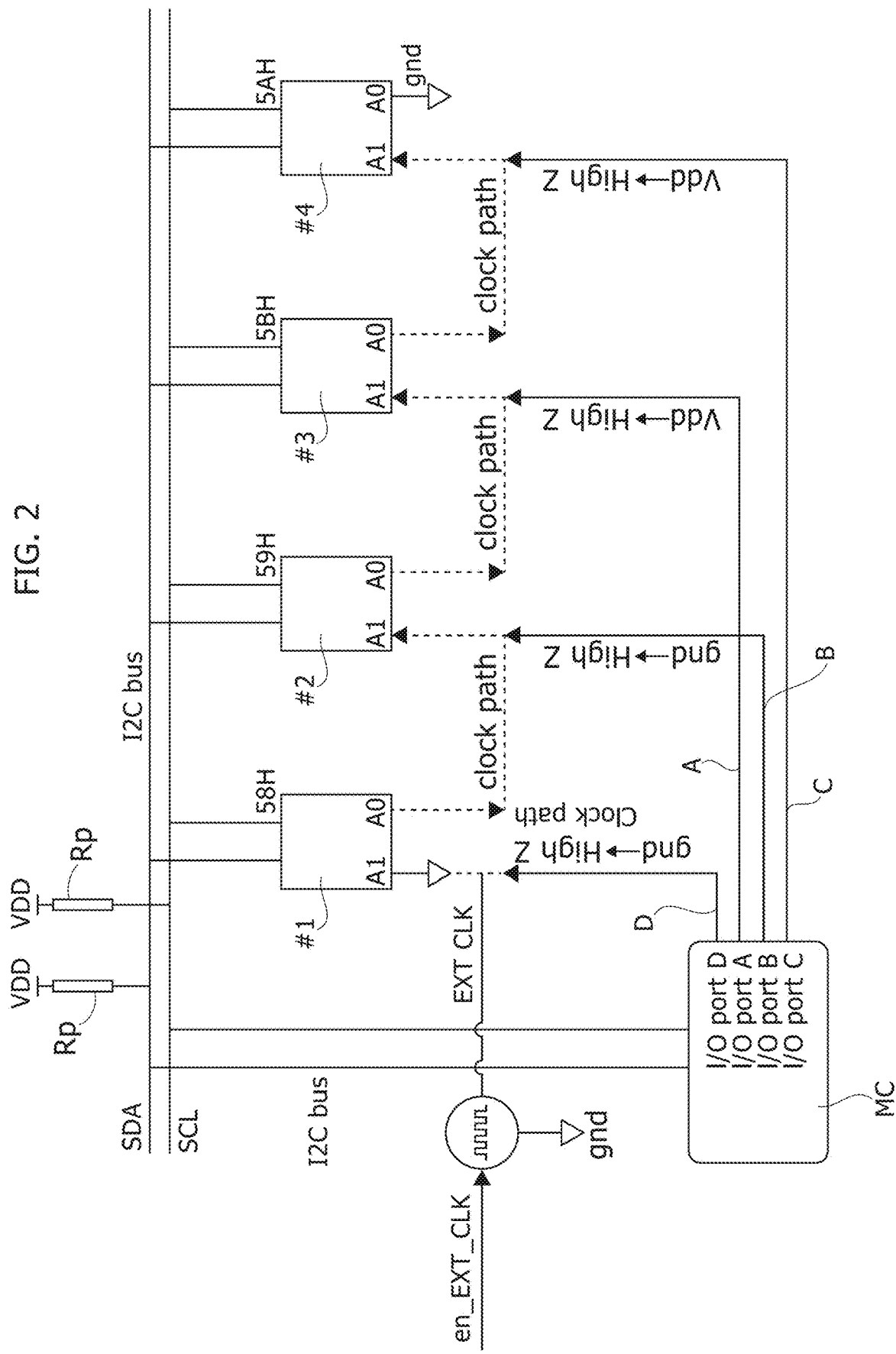
FIG. 2 is a block diagram exemplary of certain possible features of embodiments.

While a generic number N of such devices may be present in embodiments, in the representations of FIG. 1 and FIG. 2 only two such devices (#1 and #2, in FIG. 1) or four devices (#1, #2, #3 and #4, in FIG. 2) are visible for simplicity.

As exemplified herein, each of the devices #1, #2, . . . includes Ax pins which can be used to assign a dedicated local slave address to each device.

These pins (two of them, labeled A0 and A1, are considered here by way of example) are coupled to a pin address latching (local slave add) circuit block 10 via respective signal paths 12, 14.

As discussed in the following, in one or more embodiments, these signal paths can be exploited as signal paths for propagating clock signals.

As exemplified herein, the signal path 12 may extend towards the pin (node) A0 from a multiplexer (MUX OUT) 16 controlled via a signal chain_out_en. While a simple representation is provided to facilitate understanding, such a selector may include a multi-bit mux selector. For instance, in the presence of four inputs, the selector may include two bits.

As exemplified herein, the multiplexer (MUX OUT) 16 facilitates selecting one of its inputs coupled to an oscillator 18 producing an oscillator output signal osc_out, with the oscillator 18 enabled via a signal EN (which, as discussed in the following, can be provided by a global slave address).

As exemplified herein, the signal path 14 may extend from the pin A1 towards another multiplexer (MUX IN) 20 controlled via a signal chain_in_en and having an input coupled to the signal osc_out from the oscillator 18.

The output from the multiplexer 20 (that is, either the signal osc_out or the signal from A1), depending on the signal chain_in_en, is supplied to a finite state machine (FSM) 22.

The FSM 22 is enabled by the signal EN (to be discussed in the following) and may receive the signal osc_out from the oscillator 18 or from pin A1 (depending on the value of signal chain_in_en) to provide output drive channels CHx (1 to n) for respective LED arrangement L1, L2, . . . , which per se may be distinct elements from the embodiments.

Save for the points discussed in the following—the structure of the various drive devices #1, #2, . . . , # N as exemplified herein is conventional in the art, thus making it unnecessary to provide a more detailed description herein.

This applies, e.g., to the arrangements which facilitate generation of various control signals (e.g. control signals EN, en_A0, en_A1, chain_in_en, chain_out_en, and so on) applied to the driver devices #1, #2, . . . as discussed in the following.

In one or more embodiments, these signals can be generated (in a manner known per se) in the microcontroller MC and transferred to the driver devices #1, #2, . . . , e.g. over the I2C bus. Corresponding signal paths may not be visible in the figures for the sake of simplicity of illustration.

For instance, signals EN, chain_in_en, chain_out_en may be (or may be indicative of) configuration bits of the LED driver device which can be programmed by the microcontroller MC via the bus I2C, while signals en_A0 and en_A1 can be configured in order that the pins A0 and A1 are configured as input; when signal chain_out_en is set via the I2C bus, signal en_A0 can be automatically set to configure pin A0 as an output.

The pin A1 can be (always) configured as an input, so that signal en_A1 is (always) reset, other than, e.g., in a LED driver device test/debug mode where certain internal signals can be brought out on A1.

The same points apply, mutatis mutandis, to the pin A0, which (see, e.g., the diagram of FIG. 1) can be used to bring out certain internal signals in a test/debug mode of the device.

Taken per se, these can again represent conventional options in the art.

Also, it will be appreciated that one or more embodiments are not intended to be used imperatively with device structures as exemplified herein.

As discussed in the following, in one or more embodiments the possibility may exist of: configuring one of the devices (e.g., the device #1) as a master device, wherein the chain_in_en selector is set, e.g., to "0" and the output osc_out from the (internal) oscillator 18 propagates through the multiplexer 20; and/or configuring the other devices (e.g., the devices #2, #3, . . . ) as slave devices wherein the chain_in_en selector is set to "1" and the signal from the pin A1 propagates through the multiplexer 20.

For each N LED driver device, Ax pins, where $x=\log_2(N)$, are used to assign a dedicated local Slave Address to each device #1, #2, . . . , # N.

Embodiments as exemplified herein include two pins A0 and A1, so that up to four devices can be addressed through an associated bus (top portion in both FIGS. 1 and 2).

An I2C bus will hereinafter be exemplified as a possible bus option having an internal slave address for use in one or more embodiments.

Of course the possibility exists of addressing a higher number of devices. For instance, document U.S. Pat. No. 9,275,000 B2 discloses an arrangement wherein up to eight devices can be addressed with two address pins. In that case each led driver device may include Ax pins, where $x=\log_2(N/2)$.

While a chain connection of N LED driver devices (e.g. #1, #2, . . . , # N) is exemplified herein, one or more embodiments may apply to N LED driver devices coupled in a "star" topology.

In a star topology, the clock output on A0 from a master device (e.g., #1, as discussed in the following) can be applied (simultaneously) to the A1 pins in the slave devices (e.g., #2, #3, . . . ). In the case of a star topology the pins A0 will be used (only) for address definition and will not be used for conveying to A0 the (master) clock from A1. In other words, the signal path 12 through the multiplexer 16 will not be enabled.

In the following, a further detailed description will be provided in respect of embodiments involving a chain topology, insofar as the same concepts disclosed adapted to be applied to a star topology as discussed above.

As noted, in a multiple device connection, pins such as A0 and A1 can be used to assign internal I2C local Slave Addresses to N led driver devices #1, #2, . . . , # N.

To that effect, the A0 and A1 pins can be connected to general purpose input/outputs (IOs) in e.g. a microcontroller MC (see FIG. 2) which facilitates configuring the I2C local slave address in each of N LED driver devices #1, #2, . . . , # N.

In one or more embodiments as exemplified herein, the microcontroller master I2C bus is connected, by an I2C bus clock (SCL) and data (SDA) lines with SDA and SCL pins in the N LED driver devices. In this context, SCL and SDA are well-known acronyms for Serial CLock and Serial DAta, respectively.

In one or more embodiments as exemplified herein, the I2C bus includes pull-up resistors Rp according to I2C standards.

In one or more embodiments as exemplified herein, at start-up, the microcontroller MC may configure its own general purpose IOs in order to drive the IO port A and the IO port C to VDD and the IO port B to GND.

In one or more possible embodiments as exemplified in FIG. 2: the IO port A may be connected to the A0 pin of the LED driver #2 and to the A1 pin of the LED driver #3; the IO port C may be connected to the A0 pin of the LED driver #3 and to the A1 pin of the LED driver #4; and the IO port B may be connected to the A0 pin of the LED driver #1 and to the A1 pin of the LED driver #2.

These IO port connections facilitate assigning to each one of the N LED driver devices a local slave address of its own as summarized in the table of FIG. 3.

The microcontroller MC may also configure the LED driver device #4 as slave, by programming via I2C, using the I2C local slave address of the LED driver device #4 (bit 0 chain_in_en of a daisy chain register—see FIG. 4).

In that way, the input of the multiplexer 20 (see FIG. 1) in the LED driver device #4 will be the signal coming from its A1 pin. Setting bit 0 of chain_in_en in the LED driver device #4 implies that the pin address latching block 10 will latch its A0 and A1 values and provide them to its I2C interface, instead of providing these information from pin A0 and A1, with LED driver #4 pin A1 now configured as input for the clock as a result of the en_A1 signal driven low.

The microcontroller MC may configure in the same way the LED driver devices #2 and #3 as slave devices, by programming via I2C (again using the I2C local slave addresses in the LED driver devices #2 and #3), bit 0 chain_in_en of daisy chain register (see FIG. 4).

In that way, the input of the multiplexer 20 (see FIG. 1) in the LED driver devices #2 and #3 will be the signal coming from the respective A1 pin.

Setting bit 0 of chain_in_en in the LED driver devices #2 and #3 implies that the pin address latching block 10 therein will latch its A0 and A1 values and provide them to its I2C interface, instead of providing that information from the pins A0 and A1, with the pin A1 in LED driver #2 and LED driver #3 now configured as an input for the clock, e.g., by the en_A1 signal driven low.

At this point, the slave devices #2, #3 and #4 will have their slave address information coming from their respective A0, A1 pins latched internally by the block 10.

The microcontroller MC will thus be in a position to release the I/O port A (I/O ports in High-Z condition) in order to be used further for clock propagation from the master device #1, by relying on the fact that, from that point on, the slave devices #2, #3 and #4 will respond with their respective I2C local addresses, e.g. 59h, 5Bh and 5Ah.

As a further act, in order to enable clock paths between slave devices #2 and #3 and between slave devices #3 and #4, the microcontroller MC will configure the LED driver devices #2 and #3 (again using the I2C local slave addresses for devices #2 and #3), bit 1 chain_out_en of the daisy chain register (see FIG. 4).

In that way, the output of the multiplexer 16 (see FIG. 1) of the LED driver devices #2 and #3 will be the signal coming from the A1 pin with the LED driver device #1 adapted to be configured as a master device.

For instance, the microcontroller MC may configure the LED driver device #1, again by programming via I2C by using the I2C local slave address, bit 1 chain_out_en.

Such an act will not produce any conflict between the A0 pin of the LED driver device #1 and the I/O port B of the microcontroller MC, with the A0 output carrying out GND (at that point of time, the internal oscillator of device #1 is still disabled) and port B forced to GND.

A further (last) step may involve releasing the I/O port B (I/O port in High-Z condition) in order to enable a clock path between the master device #1 and the slave device #2.

It will be appreciated that setting I/O port lines free does not imply that each one of the N LED devices will be unable to respond to its own local address: thanks to the pin address latching block 10, the initial information provided by the microcontroller MC by the A0 and A1 pins will be latched internally of each one of the N LED driver devices. These devices will thus be able to answer over I2C at the respective I2C local slave address for forwarding on-the-fly channel configurations from the microcontroller MC.

The system will now be ready to be started simultaneously by setting EN=1 (enable signal to the oscillator 18) by an I2C Global Slave Address (5Ch, but this can be chosen differently) on all devices #1, #2, . . . , # N.

As noted, the I2C global slave address may be an I2C address recognized as a valid address by all the (e.g., N) LED drivers coupled to I2C.

In the LED driver device #1 (namely, the master device) the EN=1 bit being set e.g. by an I2C global address will activate the oscillator 18 and the FSM 22.

Conversely, in the other LED driver devices #2, . . . , # N (namely, the slave devices), setting chain_in_en=1 may lead to the oscillator 18 therein remaining inactive insofar as the associated circuitry may exploit the clock signal applied on the input A1 via clock path 14-20: e.g., the FSMs 22 will start-up and operate with the oscillator clock of the master device (e.g., #1 in the exemplary case discussed here) coming from their A1 pins.

Each one of the N−1 slave LED driver device (e.g., #2, . . . , # N) will from now operate (time) aligned with the master LED driver device #1.

Also, generation of PWM signals from the FMSs 22 can be halted simultaneously by setting EN=0 for all devices e.g., by the I2C global address.

As noted at the outset of this description, one or more embodiments may involve reconfiguring some "non-dedicated" LED driver input/output pins (IOs) used to assign respective local I2C addresses to the N LED drivers in order to facilitate exploiting a single clock signal thereby dispensing with dedicated synchronization input and output pins for each of the N LED drivers.

It will be otherwise appreciated that, in one or more embodiments, along with the coupling (e.g., a "daisy-chain" connection) to other identical devices as exemplified in the figures, each and every LED driver device, e.g., #1, #2, . . . may retain its capability of operating in a "stand-alone" mode, by exploiting for that purpose the respective internal oscillator 18 that can be activated via the signal (bit) EN, programmable via the I2C bus.

In addition to enabling the internal oscillator 18 such a signal may also be exploited to enable other circuitry including the channels to which the LED units L1, L2, . . . may be connected.

The programming bit EN can be written individually in each device, e.g., #1, #2, . . . , by using its own slave address (e.g., 58H, 59H, 5AH, 5BH).

This may be the case when a single, individual LED driver device #1, #2, . . . , is intended to be turned on or when all the LED driver devices #1, #2, . . . , are intended to be turned on the same time, which may occur via a "global" slave address recognized by all the LED driver devices connected to the I2C communication bus. This may result in a simultaneous activation of all driver devices #1, #2, . . . , connected to the I2C bus and the LED units L1, L2, . . . driven thereby.

Conversely, as a result of adopting the coupling (e.g., a "daisy-chain" connection) exemplified herein such "global" EN signal may turn on the FSMs in the LED driver devices #1, #2, . . . , with the FSMs in the slave devices #2, #3, . . . exploiting the clock signal received from the master device #1.

In one or more embodiments, in those devices configured as slaves (e.g., #2, #3, . . . ) the programming bits of chain_in_en can be set, e.g., to "1" with chain_out_en also set, e.g. to "1". In that case, the multiplexer 16 in the slave devices #2, #3, . . . will propagate towards A0—in the place of the signal from the respective internal oscillator 18—the output from the multiplexer 20 which in turn will obtain the clock signal from the "previous" device in the chain as received at the input A1.

The last slave device in the chain (e.g., slave device #4 in FIG. 2) will have chain_in_en=1 and chain_out_en=0 and therefore will accept on input A1 the clock coming from slave #3 without propagating it to output on A0 via MUX 16.

Throughout the detailed description of exemplary embodiments provided herein so far the (single) clock propagated from the device #1 has been assumed to be the clock signal from the oscillator 18 in that device (e.g., #1).

Stated otherwise, in certain embodiments, the "master" configuration of, e.g. device #1, can be adopted (possibly in a selective, programmable manner) when exploiting the clock produced by its internal oscillator 18 as a clock signal for the chain of devices.

In certain embodiments, the single clock signal propagated over the chain can be sourced (as a possible alternative to the clock signal generated by the oscillator 18 in the device #1) from an external clock EXT CLK sourced—in any known manner—as schematically exemplified in FIG. 2.

For instance, the possibility exists of providing a line coupled to, e.g., the D port of the microcontroller MC. This may be coupled to ground (e.g. according to the diagram of FIG. 1).

In one or more embodiments that line can be at first coupled to ground and then switched to a desired frequency conveying the external clock to the device #1 which at this point can be configured as slave device receiving the clock signal EXT CLK via the pin A1.

In that case, the global enable may be set as a step following configuration of the devices. As exemplified herein, the external oscillator providing the signal EXT CLK may be enabled via a signal en_CLK_EXT. This facilitates applying that clock signal to the pin A1 of the first device (e.g. #1) only after configuration thereof (setting of chain_in_en=1 and chain_out_en=1), that is only after the microcontroller MC has released the line D, which goes to High-Z. This facilitates avoiding conflicts on the D line of the controller.

Stated otherwise, after the device #1 has been configured with chain_in_en=1 e chain_out_en=1, the external clock source can be enabled by setting en_CLK_EXT=1 and then the global enable can be set, e.g., to "1" via the bus I2C.

The source of EXT CLK can be, e.g. a high-accuracy clock source already available to the circuit exemplified for other purposes.

In that case, the device #1 will eventually share the same "slave" configuration of the other devices, #2, #3, . . . and thus accept the external clock source EXT CLK as input on pin A1 and transmit that clock signal to the "subsequent" device (e.g., device #2) on pin A0.

As noted previously, the concepts and operating principles described herein in connection with a chain topology will apply mutatis mutandis to a star topology as considered in the foregoing.

In a circuit according to one or more embodiments, the circuit may include a set of LED driver devices (e.g., #1, #2, . . . ) comprising a finite state machine (e.g., 22) configured to generate LED drive PWM-modulated signal patterns (e.g., CHx) as well as an oscillator (e.g., 18) generating a clock signal (e.g., osc_out) for the finite state machine. The LED driver devices in the set of LED driver devices may be coupled (e.g., SDA, SCL) via a bus (e.g. I2C bus), the LED driver devices in the set of LED driver devices having bus pins (e.g., I2C) coupled to the bus as well a set of slave address pins comprising at least one first (e.g., A1) and one second (e.g., A0) slave address pin. The LED driver devices in the set of LED driver devices may include: a first signal path (e.g., 14, 20) activatable (e.g., en_A1, chain_in_en) between the first slave address pin and the finite state machine; and a second signal path (e.g., 12, 16) activatable (e.g., en_A0, chain_out_en) between the finite state machine and the second slave address pin. The circuit may include a controller (e.g. MC) having a set of (e.g. general-purpose input/output nodes such as A, B, C) coupled to the slave address pins in the LED driver devices in the set of LED driver devices, wherein the controller may be configured to: provide via the slave address pins of the LED driver devices in the set of LED driver devices at least one inter-device clock signal propagation path from the second slave address pin in one (e.g., #1) LED driver device in the set of LED driver devices to the first slave address pin in another (e.g., #2) LED driver device in the set of LED driver devices; and activate (e.g., en_A0, chain_out_en, en_A1, chain_in_en) the second signal path between the finite state machine and the second slave address pin in the one LED driver device and the first signal path between the first slave address pin and the finite state machine in the another LED driver device in the set of LED driver devices, wherein a clock signal (e.g., osc_out; EXT CLK) coupled to the finite state machine in the one LED driver device in the set of LED driver devices is coupled to the finite state machine in the another LED driver device in the set of LED driver devices via the activated second signal path and first signal path and the at least one inter-device clock signal propagation path.

In one or more embodiments, the one LED driver device (#1) in the set of LED driver devices may have the first slave address pin configured to receive an external clock signal (e.g., EXT CLK in FIG. 2) and couple the external clock signal to the finite state machine in the one LED driver device in the set of LED driver devices via the first signal path between the first slave address pin and the finite state machine in the one LED driver device in the set of LED driver devices.

In one or more embodiments, the finite state machine in the one LED driver device in the set of LED driver devices may be coupled to the oscillator in the one LED driver device in the set of LED driver devices to receive the clock signal (e.g. osc_out) generated thereby.

In one or more embodiments: the controller (MC) may be coupled to the bus and configured to transmit over the bus to the bus pins in the LED driver devices in the set of LED driver devices configuration data of the one (e.g., #1) of the LED driver devices in the set of LED driver devices as a master device and of a plurality of other LED driver devices (e.g., #2, #3, #4) in the set of LED driver devices as a plurality of slave devices. The master device may have the second signal path activated to couple to the second slave address pin the clock signal generated by the oscillator (18) in the master device; and the slave devices have the first signal path activated to couple to the finite state machines therein the clock signal generated by the oscillator in the master device obtained at the first slave address pin.

In one or more embodiments: the master device may have the first slave address pin set to ground; and/or the master device and the plurality of slave devices may be coupled in a (e.g., daisy-chain) chain arrangement comprising a last slave device in the chain, wherein the last slave device (e.g. #4) in the chain may have the second slave address pin set to ground.

In one or more embodiments, the controller may have has a set of (e.g. general-purpose input/output nodes, such as A, B, C) each coupled to the second slave address pin of one of the devices in the set of LED driver devices and to the first slave address pin of another one of the devices in the set of LED driver devices.

In one or more embodiments, the controller may be configured to provide over via the bus a global bus address (e.g. EN) to the LED driver devices in the set of LED driver devices, the global bus address configured to be set alternatively to a first one resp. a second one binary value to provide coordinated activation, resp. de-activation, of the finite state machines in the LED driver devices in the set of LED driver devices.

In one or more embodiments, the LED driver devices in the set of LED driver devices may include respective pin address latching blocks (e.g., 10) configured to latch values for the at least one first and one second slave address pins and provide such latched values to the bus via the bus pins coupled to the bus.

A device according to one or more embodiments (e.g. an automotive light) may include: a circuit according to one or more embodiments; and a set of LED light radiations sources (e.g. L1, L2) coupled (e.g. at 22) with respective LED driver devices in the set of LED driver devices to be driven thereby.

A method of operating a circuit or a device according one or more embodiments may include: coupling a clock signal (e.g., osc_out; EXT CLK) to the finite state machine in the one LED driver device in the set of LED driver devices; and activating (e.g. en_A0, chain_out_en, en_A1, chain_in_en) the second signal path between the finite state machine and the second slave address pin in the one LED driver device and the first signal path between the first slave address pin and the finite state machine in the another LED driver device in the set of LED driver devices, wherein the clock signal (e.g., osc_out; EXT CLK) coupled to the finite state machine in the one LED driver device in the set of LED driver devices is coupled to the finite state machine in the another LED driver device in the set of LED driver devices via the activated second signal path and first signal path and the at least one inter-device clock signal propagation path.

Without prejudice to the underlying principles, the details and embodiments may vary, even significantly, with respect to what has been described herein by way of example only, without departing from the extent of protection.

What is claimed is:

1. A circuit, comprising:
  a set of LED driver devices, each LED driver device comprising:
    a finite state machine configured to generate LED drive PWM-modulated signal patterns;
    an oscillator configured to generate a clock signal for the finite state machine;
    a set of slave address pins comprising a first slave address pin and a second slave address pin;
    a first signal path activatable between the first slave address pin and the finite state machine; and
    a second signal path activatable between the finite state machine and the second slave address pin; and
  a controller comprising a set of nodes coupled to the first slave address pin and the second slave address pin in each LED driver devices in the set of LED driver devices, wherein the controller (MC) is configured to:
    provide, via the first slave address pin and the second slave address pin of the LED driver devices in the set of LED driver devices, at least one inter-device clock signal propagation path from the second slave address pin in one LED driver device in the set of LED driver devices to the first slave address pin in another LED driver device in the set of LED driver devices; and
    activate the second signal path between the finite state machine and the second slave address pin in the one LED driver device and the first signal path between the first slave address pin and the finite state machine in the another LED driver device in the set of LED driver devices, wherein the clock signal is coupled to the finite state machine in the one LED driver device and to the finite state machine in the another LED driver device via an activated second signal path, an activated first signal path, and the at least one inter-device clock signal propagation path.

2. The circuit of claim 1, wherein the LED driver devices in the set of LED driver devices are coupled via a bus, the LED driver devices in the set of LED driver devices having bus pins coupled to the bus.

3. The circuit of claim 1, wherein the first slave address pin of the one LED driver device is configured to receive an external clock signal, the one LED driver device being configured to couple the external clock signal to the finite state machine in the one LED driver device via the first signal path between the first slave address pin and the finite state machine in the one LED driver device.

4. The circuit of claim 1, wherein the finite state machine in the one LED driver device is coupled to receive the clock signal generated by the oscillator in the one LED driver device.

5. The circuit of claim 4, wherein the LED driver devices in the set of LED driver devices are coupled via a bus, the LED driver devices in the set of LED driver devices having bus pins coupled to the bus, wherein the controller is coupled to the bus and configured to transmit, over the bus to the bus pins in the LED driver devices, configuration data of the one LED driver device as a master device and of a plurality of other LED driver devices in the set of LED driver devices as a plurality of slave devices.

6. The circuit of claim 5, wherein the master device comprises the second signal path activated to couple, to the second slave address pin, the clock signal generated by the oscillator in the master device, and wherein the plurality of slave devices comprise the first signal path activated to couple, to the finite state machines therein, the clock signal generated by the oscillator in the master device obtained at the first slave address pin.

7. The circuit of claim 5, wherein the master device comprising the first slave address pin is set to ground.

8. The circuit of claim 5, wherein the master device and the plurality of slave devices are coupled in a chain arrangement comprising a last slave device in the chain arrangement, wherein the last slave device in the chain arrangement comprises the second slave address pin set to ground.

9. The circuit of claim 1, wherein each node of the set of nodes of the controller is coupled to the second slave address pin of the one LED driver device and to the first slave address pin of the another LED driver device.

10. The circuit of claim 1, wherein the LED driver devices in the set of LED driver devices are coupled via a bus, the LED driver devices in the set of LED driver devices having bus pins coupled to the bus, wherein the controller is configured to provide, via the bus, a global bus address to the LED driver devices in the set of LED driver devices.

11. The circuit of claim 10, wherein the global bus address is configured to be set to a first binary value or a second binary value to respectively provide coordinated activation or de-activation of the finite state machines in the LED driver devices in the set of LED driver devices.

12. The circuit of claim 10, wherein the LED driver devices in the set of LED driver devices comprise respective pin address latching blocks configured to latch values for the first slave address pin and the second slave address pin and to provide the latched values to the bus via the bus pins coupled to the bus.

13. A device, comprising:
a circuit, comprising:
   a set of LED driver devices, each LED driver device comprising:
      a finite state machine configured to generate LED drive PWM-modulated signal patterns;
      an oscillator configured to generate a clock signal for the finite state machine;
      a set of slave address pins comprising a first slave address pin and a second slave address pin;
      a first signal path activatable between the first slave address pin and the finite state machine; and
      a second signal path activatable between the finite state machine and the second slave address pin; and
   a controller comprising a set of nodes coupled to the first slave address pin and the second slave address pin in each LED driver devices in the set of LED driver devices, wherein the controller (MC) is configured to:
      provide, via the first slave address pin and the second slave address pin of the LED driver devices in the set of LED driver devices, at least one inter-device clock signal propagation path from the second slave address pin in one LED driver device in the set of LED driver devices to the first slave address pin in another LED driver device in the set of LED driver devices; and
      activate the second signal path between the finite state machine and the second slave address pin in the one LED driver device and the first signal path between the first slave address pin and the finite state machine in the another LED driver device in the set of LED driver devices, wherein the clock signal is coupled to the finite state machine in the one LED driver device and to the finite state machine in the another LED driver device via an activated second signal path, an activated first signal path, and the at least one inter-device clock signal propagation path; and
a set of LED light radiations sources coupled to and configured to be driven by respective LED driver devices in the set of LED driver devices.

14. The device of claim 13, wherein the LED driver devices in the set of LED driver devices are coupled via a bus, the LED driver devices in the set of LED driver devices having bus pins coupled to the bus.

15. The device of claim 13, wherein the first slave address pin of the one LED driver device is configured to receive an external clock signal, the one LED driver device being configured to couple the external clock signal to the finite state machine (22) in the one LED driver device via the first signal path between the first slave address pin and the finite state machine in the one LED driver device.

16. The device of claim 13, wherein the finite state machine in the one LED driver device is coupled to receive the clock signal generated by the oscillator in the one LED driver device.

17. The device of claim 16, wherein the LED driver devices in the set of LED driver devices are coupled via a bus, the LED driver devices in the set of LED driver devices having bus pins coupled to the bus, wherein the controller is coupled to the bus and configured to transmit, over the bus to the bus pins in the LED driver devices, configuration data of the one LED driver device as a master device and of a plurality of other LED driver devices in the set of LED driver devices as a plurality of slave devices.

18. The device of claim 17, wherein the master device comprises the second signal path activated to couple, to the second slave address pin, the clock signal generated by the oscillator in the master device, and wherein the plurality of slave devices comprise the first signal path activated to couple, to the finite state machines therein, the clock signal generated by the oscillator in the master device obtained at the first slave address pin.

19. The device of claim 17, wherein the master device comprising the first slave address pin is set to ground.

20. A method of operating a circuit, the method comprising:
   having a set of LED driver devices, each LED driver device comprising:
      having a finite state machine configured to generate LED drive PWM-modulated signal patterns;
      having an oscillator configured to generate a clock signal for the finite state machine;
      having a set of slave address pins comprising a first slave address pin and a second slave address pin;
      having a first signal path activatable between the first slave address pin and the finite state machine; and
      having a second signal path activatable between the finite state machine and the second slave address pin; and
      having a controller comprising a set of nodes coupled to the first slave address pin and the second slave address pin in each LED driver devices in the set of LED driver devices;
   providing, by the controller via the first slave address pin and the second slave address pin of the LED driver devices in the set of LED driver devices, at least one inter-device clock signal propagation path from the second slave address pin in one LED driver device in the set of LED driver devices to the first slave address pin in another LED driver device in the set of LED driver devices; and
   coupling the clock signal to the finite state machine in the one LED driver device in the set of LED driver devices; and
   activating, by the controller, the second signal path between the finite state machine and the second slave address pin in the one LED driver device and the first signal path between the first slave address pin and the finite state machine in the another LED driver device in the set of LED driver devices, wherein the clock signal is coupled to the finite state machine in the one LED driver device and to the finite state machine in the another LED driver device via an activated second signal path, an activated first signal path, and the at least one inter-device clock signal propagation path.

21. The method of claim 20, wherein the LED driver devices in the set of LED driver devices are coupled via a bus, the LED driver devices in the set of LED driver devices having bus pins coupled to the bus.

22. The method of claim 20, further comprising receiving an external clock signal at the first slave address pin of the one LED driver device, and coupling the external clock signal to the finite state machine in the one LED driver device via the first signal path between the first slave address pin and the finite state machine in the one LED driver device.

23. The method of claim 20, further comprising coupling the finite state machine in the one LED driver device to receive the clock signal generated by the oscillator in the one LED driver device.

24. The method of claim 23, wherein the LED driver devices in the set of LED driver devices are coupled via a bus, the LED driver devices in the set of LED driver devices having bus pins coupled to the bus, wherein the controller is coupled to the bus and configured to transmit, over the bus to the bus pins in the LED driver devices, configuration data of the one LED driver device as a master device and of a plurality of other LED driver devices in the set of LED driver devices as a plurality of slave devices.

25. The method of claim 24, wherein the master device comprises the second signal path activated to couple, to the second slave address pin, the clock signal generated by the oscillator in the master device, and wherein the plurality of slave devices comprise the first signal path activated to couple, to the finite state machines therein, the clock signal generated by the oscillator in the master device obtained at the first slave address pin.

\* \* \* \* \*